Figure 1:
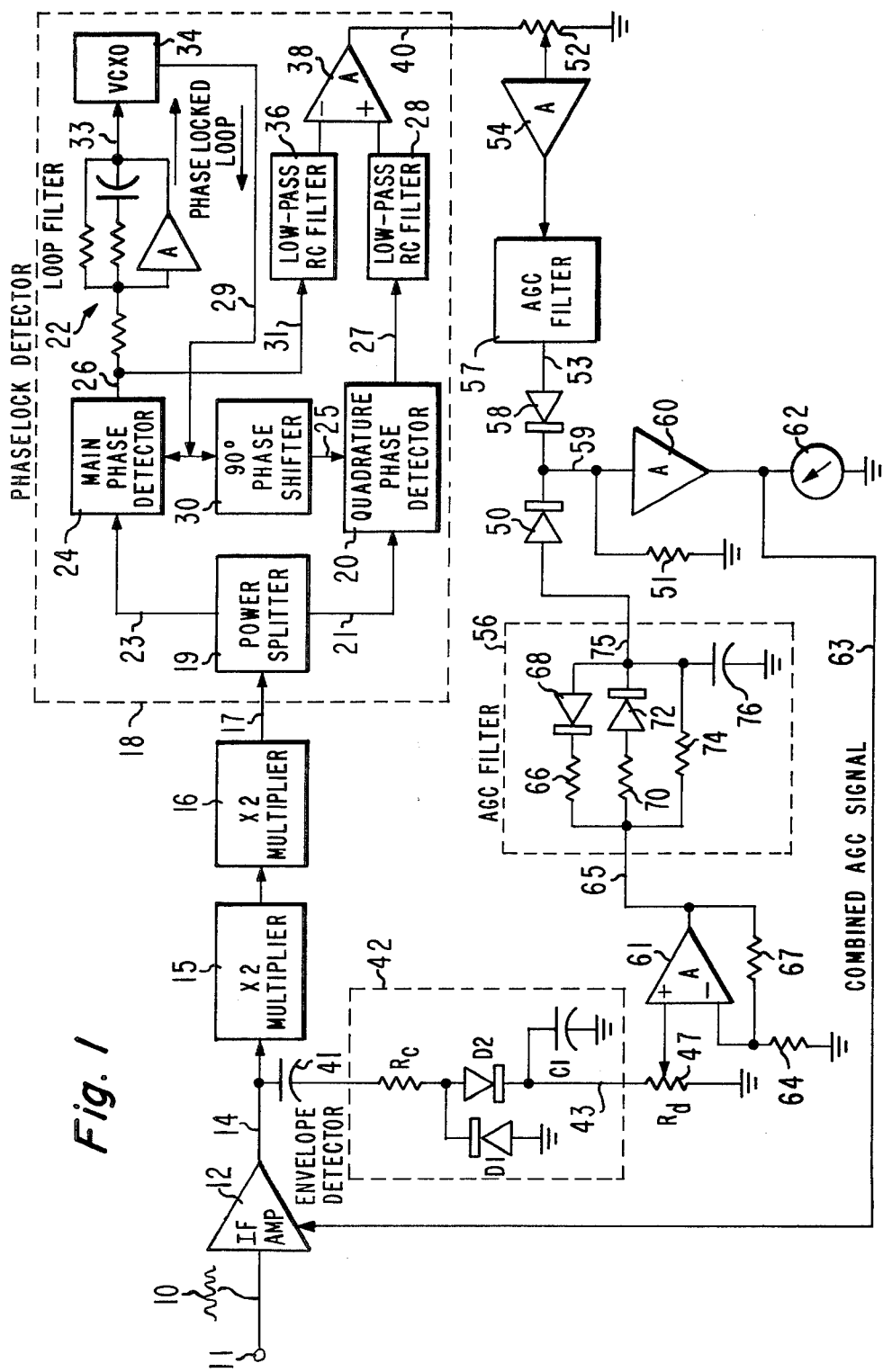

United States Patent [19]
Daniel, Jr.

[11] Patent Number: 4,479,253
[45] Date of Patent: Oct. 23, 1984

[54] PHASELOCK RECEIVER WITH INPUT SIGNAL MEASURING CAPABILITY

[75] Inventor: James W. Daniel, Jr., Cherry Hill, N.J.

[73] Assignee: RCA Corporation, New York, N.Y.

[21] Appl. No.: 340,453

[22] Filed: Jan. 18, 1982

[51] Int. Cl.³ .................. H04B 17/00; H04B 1/16
[52] U.S. Cl. .................. 455/226; 375/10; 375/98; 455/246; 455/265
[58] Field of Search .............. 455/226, 234, 246, 265, 455/303; 375/10, 98, 102

[56] References Cited

U.S. PATENT DOCUMENTS

| | | |
|---|---|---|
| 3,821,649 | 6/1974 | Grosjean . |
| 4,048,566 | 9/1977 | Carson et al. . |
| 4,186,351 | 1/1980 | Brefini et al. . |
| 4,213,096 | 7/1980 | Daniel .................. 455/260 |
| 4,225,976 | 9/1980 | Osborne et al. .................. 455/226 |
| 4,270,221 | 5/1981 | Daniel, Jr. .................. 455/265 |
| 4,317,206 | 2/1982 | Nossen .................. 375/10 |

OTHER PUBLICATIONS

F. M. Gardner, *Phaselock Techniques*, 1966, pp. 52–53, 90–100.

*Primary Examiner*—Marc E. Bookbinder
*Attorney, Agent, or Firm*—Joseph S. Tripoli; Robert L. Troike; Christopher Lyle Maginniss

[57] ABSTRACT

In a communications receiver where the AGC signal derived from a phaselock detector is used to measure input signal strength, and that measurement is subject to error as a result of the nonlinear devices used in the carrier demodulation, a signal having inversely corresponding error characteristics is summed to the phaselock detector AGC signal to produce an improved AGC signal which is substantially linearly related to the input signal. That signal, having the inversely corresponding error characteristics, has been found to be the signal representation of the envelope of either the positive or negative cycles of the input signal.

15 Claims, 2 Drawing Figures

PHASELOCK RECEIVER WITH INPUT SIGNAL MEASURING CAPABILITY

This invention relates to satellite communications and, more particularly, to an apparatus for measuring the strength of a modulated signal received from a satellite.

In the area of satellite communications, modems (modulator-demodulators) are generally required to measure the level of the IF input signal, representing the strength of the signal received from the satellite. This measurement permits the system operator to minimize the power required for each communications link and to determine the power loading of the satellite.

Among the modems used in satellite communications, the most common forms of modulation are bi-phase shift keying (BPSK) and quadrature phase shift keying (QPSK) Demodulation of these signals involves reconstruction of the carrier signal from the input signal. This is accomplished by doubling the frequency of the input signal in the case of BPSK, and frequency quadrupling the input signal for QPSK. This frequency multiplying process removes the phase shift modulation from the input signal leaving only the reconstructed carrier. Full-wave diode rectifiers are often used as frequency doublers in this and similar applications; two such rectifiers in tandem serve as frequency quadruplers.

However, because additive noise inevitably corrupts satellite transmissions, it is necessary to distinguish the carrier frequency signal from the unwanted noise. Perhaps the most effective method of accomplishing this discrimination is by phaselocking a voltage-controlled oscillator (VCO) to the multiplier output signal. Typical phaselocking techniques involve comparing the noisy carrier signal to the output of the voltage-controlled oscillator by a phase detector. The voltage level of the output signal of the phase detector is a measure of the phase difference between its inputs. The difference voltage is filtered by a loop filter and applied to the VCO. The control voltage on the VCO changes the oscillator frequency in a direction which reduces the phase difference between the input signal and the oscillator output, resulting in a VCO signal that is locked to the average frequency of the input signal. The resultant phaselock loop thus functions as a tracking filter. The radio frequency (RF) signal output of the VCO (which represents a cleaned-up version of the reconstructed carrier) is mixed with the input signal and the resultant output of the mixer is the demodulated data.

It is well known to use the signal indicative of phaselock as a source of coherent AGC to control the gain of an IF input amplifier. See *Phaselock Techniques* by Floyd M. Gardner, published by John Wiley & Sons, Inc., New York, in 1966, at pages 52–53 and 90–100. The reference at page 90 teaches that measurement of the AGC control voltage is a convenient way of obtaining signal level indication. This method has also been proven to be the most cost effective way to measure input signal level. However, in a phase shift keying modulating scheme in which the carrier is recovered from the received signal by passing the input signal through multipliers which are nonlinear devices, the presence of noise on the input signal causes the reconstructed carrier signal to be suppressed before it is applied to the phaselock detector. The reduced-level carrier signal applied to the phaselock detector results in an input signal which is weaker by the amount of signal suppression in the multipliers. Hence, a signal level meter measuring the AGC signal voltage as indicative of input signal strength will give erroneous results when the input signal is corrupted by noise. The measuring error can be in excess of 6 dB.

In accordance with one embodiment of the present invention, a communications receiver is disclosed which includes means for extracting the carrier signal from a modulated radio frequency input signal and means responsive to the carrier signal for generating a control signal indicative of the strength of the carrier signal. The carrier extracting means includes nonlinear elements such that the strength of the carrier signal is not linearly related to the strength of the input signal. The present invention improves the communications receiver by providing a measuring signal which is substantially linearly related to the strength of the input signal. The improvement includes detector means responsive to the input signal for providing a signal representative of the envelope of the input signal, and means for combining the envelope detector signal and the control signal to produce the measuring signal which is substantially linearly related to the strength of the input signal.

Figure 2:
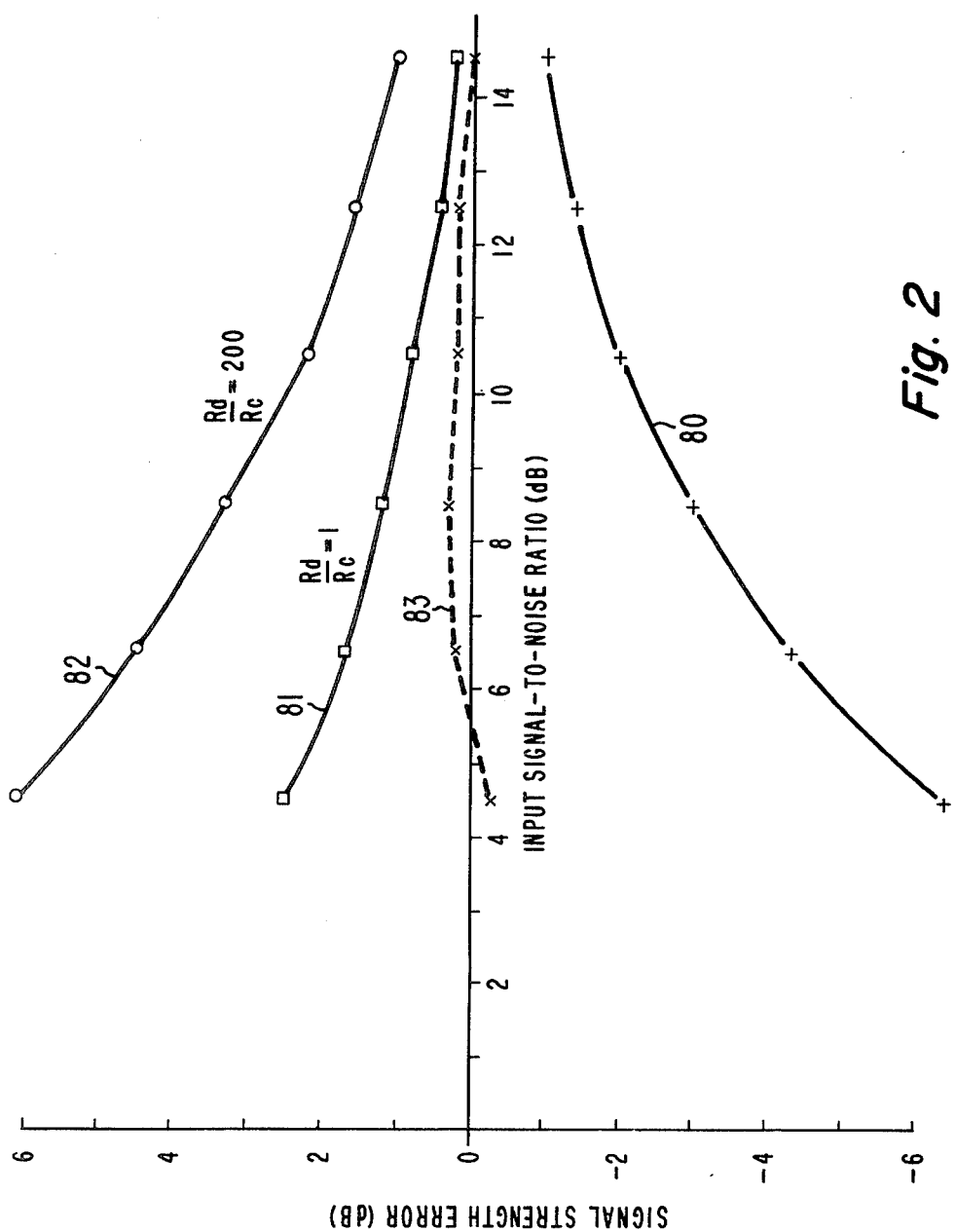

In the drawing:

FIG. 1 of the drawing is a block diagram of a portion of a phaselock receiver including an apparatus for measuring the strength of an input signal; and FIG. 2 is a graph of error signals useful in explaining the operation of the apparatus of FIG. 1.

The present invention represents an improved capability, that of input signal strength measurement, in a communications receiver such as a phaselock receiver of the type disclosed in U.S. Pat. No. 4,213,096, "Phaselock Receiver With Phaselock Detector," issued July 15, 1980, to the present inventor and incorporated herein by reference. The phaselock detector of the above-mentioned patent is used in one preferred embodiment of the present invention.

The basic concept underlying the present invention is stated as follows: because the conventional method of measuring the strength of a phase shift keying modulated input signal, that of measuring the lock indicating signal provided by a phaselock detector, is subject to error, which error is related to the noise content of the input signal, a second signal may be combined with the phaselock detector output signal, which second signal has a complementary error response to signal-to-noise than that of the phaselock detector output signal, to thereby compensate for the error in the phaselock detector output signal and provide a measuring signal which is substantially linearly related to the strength of the input signal. Such a compensating signal, having error characteristics which are opposite to those of the phaselock detector output signal error, has been found to be the response of an envelope detector when measuring a constant signal over a range of signal-to-noise ratios. Thus, the output signal of an envelope detector, designed to give an error response having magnitude which is equal to and opposite from the error characteristic of the phaselock detector control signal, when combined with that control signal, will result in a signal which is substantially unaffected by variations in signal-to-noise and hence be a substantially true measure of input signal strength. The balance of this disclosure describes an apparatus embodying that concept.

Referring to FIG. 1, a block diagram of the improved phaselock receiver is shown. The receiver of the present example is of the type used for carrier extraction of the quadrature phase shift keying (QPSK) modulated signals, but one of ordinary skill in the art will recognize that the invention is equally applicable to many modes of carrier modulation of radio signals including, but not limited to, double sideband suppressed carrier and other forms of phase shift keying modulated signals, further including bi-phase shift keying (BPSK) modulation.

Input signal 10, typically a 70 MHz signal (after down conversion), for example, received from a satellite, is applied at input terminal 11 and is coupled to IF amplifier 12. The gain of amplifier 12 may be varied according to the voltage level of the AGC signal on lead 63. The output signal of amplifier 12 is applied via lead 14 to two cascaded frequency multipliers 15 and 16, each of which doubles the frequency of its input signal, to thereby provide a frequency quadrupling of the signal on lead 14. As mentioned earlier, frequency multipliers 15 and 16 may be, for example, full-wave diode rectifiers providing two positive (or negative) pulses for each full cycle of the signal on lead 14. If input signal 10 were a BPSK modulated signal, only one multiplier 15 would be required. Multipliers 15 and 16 effect a reconstitution of the original carrier signal. The multiplier output signal on lead 17, which frequency spectrum has a single component at the multiplied frequency (280 MHz in the present example) as a result of the demodulation, is applied to phaselock detector 18, which is described in complete detail in the cited patent reference, and in sufficient detail below to permit an understanding of its function within the present invention.

The extracted carrier on signal lead 17 is applied to equal power splitter 19 having one output on lead 23 connected to the signal input of a main phase detector 24, and having a second output on lead 21 for coupling an equal strength signal to the signal input of a quadrature phase detector 20. The main phase detector 24 is in a phaselocked loop which includes a voltage-controlled crystal oscillator (VCXO) 34 having an output on lead 29 coupled to the second input of the main phase detector 24. The phase error output on lead 26 from the phase detector 24 is applied through a loop filter and amplifier 22 to the control-voltage input 33 of VCXO 34. The described phase controlled loop normally operates to maintain the VCXO 34 in phaselock with an input signal received on lead 17.

Means in the system for determining when the VCXO 34 is or is not locked onto the input signal on signal lead 17 includes a 90° phase shifter 30 receptive to the output at lead 29 from the oscillator 34, and having an output at signal lead 25 for applying a 90°-phase-shifted oscillation to the local oscillator input of the quadrature phase detector 20. The quadrature phase detector 20 may be exactly the same as the main phase detector 24. Detector 20 has an output on signal lead 27 coupled through a low-pass resistor-capacitor (RC) filter 28 which may pass frequencies below 100 Hz to the positive (+) input of a differential amplifier 38. The output of amplifier 38 is useful in the receiver as a coherent AGC signal on lead 40.

Low-pass RC filter 36, passing frequencies below 100 Hz, is similar to filter 28. Filter 36 is receptive over line 31 to the output from the main phase detector 24, and filter 36 supplies an output to the negative (−) input of differential amplifier 38. When the system is out-of-lock, the output of the main phase detector 24 is an asymmetrical beat note wave which, after passing through filter 36, appears as a small dc component of about 50 millivolts, which is the same as the output from filter 28 which is receptive to the output of quadrature phase detector 20 on line 27. The small dc component produced at the output of filter 36 is subtracted in differential amplifier 38 from the similar equal small dc component produced at the output of filter 28. Accordingly, the output of differential amplifier 38, the signal at lead 40, is substantially zero volts when the system is out-of-lock. When the system is in-lock the output voltage of the main phase detector 24 is zero and the output voltage of quadrature phase detector 20 is a large dc voltage. Thus, there is a large dc voltage at the output of differential amplifier 38 when the system is in-lock. When the phaselock loop is locked, that is when VCXO 34 is in-phase with the reconstituted carrier portion of the signal on lead 17, a dc voltage which is proportional to the amplitude of the input signal on lead 17 is generated by amplifier 38 on lead 40.

Envelope detector 42 comprises diodes D1 and D2, capacitor C1 and charging resistor $R_c$. Capacitor 41 blocks the dc component of the QPSK modulated input signal; the ac portion of the signal is applied to envelope detector 42 where diode D1 shunts the negative portion of the wave to ground, and the positive portion of the signal is applied through charging resistor $R_c$ and diode D2 where it charges C1. Thus, the positive envelope of the input signal appears on lead 43. The polarity of diode D2 ensures that capacitor C1 discharges only through discharging resistor $R_d$, also referred to as gain control 47.

The output of envelope detector 42 on lead 43 and the output of phaselock detector 18 on lead 40 are coupled, respectively, through gain controls 47 and 52, which are both potentiometers. Gain controls 47 and 52 allow the detector outputs to be varied such as to minimize the error of the combined AGC signal on lead 63; they also establish the amplitude of the signal on lead 14 by setting the level of the signal on lead 63, which signal determines the gain of IF amplifier 12. The output of envelope detector gain control 47 is amplified by amplifier 61, filtered by AGC filter 56, and applied to the anode of diode 50. The output of phaselock detector gain control 52 is amplified by amplifier 54, filtered by AGC filter 57, and applied to the anode of diode 58. Resistor 64, coupled to the negative (−) input of amplifier 61 in the envelope detector path, is a sensitor which, in combination with feedback resistor 67, compensates for variations of the output signal of envelope detector 42 due to temperature by controlling the gain of the amplifier 61.

AGC filter 56 includes capacitor 76 which is charged through the series combination of resistor 70 and diode 72 and which discharges through the series combination of resistor 66 and diode 68. A relatively small resistance value for resistor 70 allows capacitor 76 to charge rapidly in response to a burst of energy on lead 65. The component values of resistor 70 and capacitor 76 establish the attack time of the AGC, which is the time for the AGC filter to settle at its final value upon receipt of a signal. Resistor 74, which has a relatively large resistance value, provides a path for a slow build-up or decay of the voltage across capacitor 76 during the time when the voltage on lead 65 is within one diode drop of the voltage at lead 75. When the voltage on lead 65 falls more than one diode drop below the voltage on lead 75, capacitor 76 discharges rapidly through the relatively low resistance path including resistor 66 and diode 68. This quick discharging action permits the receiver to detect a weak signal immediately following receipt of a strong signal. AGC filter 57 is identical to filter 56 and, because their outputs are summed to form the combined AGC signal on lead 63, it is important that their components be fairly matched in order to provide a uniform gain control signal to IF amplifier 12.

The cathodes of diodes 50 and 58 are interconnected so as to develop a voltage across resistor 51, which voltage is the sum of the voltages of the envelope detector signal on lead 75 and the phaselock detector signal on lead 53. Thus, for an error of diminishment of the signal in the phaselock detector path which is offset by an error of amplification of the signal in the envelope detector path, the summed output on signal lead 59 substantially effects a cancellation of those errors. The signal on lead 59 is amplified by amplifier 60 and the amplifier output on lead 63 serves as both the combined AGC signal utilized by IF amplifier 12 and the measuring signal applied to meter 62. IF amplifier 12 includes a voltage-controlled attenuator which varies the IF gain as a function of the control voltage on lead 63. The action of this AGC loop is to maintain a constant signal amplitude at the IF output on lead 14. Measurement of the input signal levels may be obtained by calibrating the combined AGC signal on lead 63. Signal level meter 62 coupled between lead 63 and ground is typically an analog voltage-indicating device calibrated to read signal level in dB.

In the embodiment of the present invention shown in FIG. 1 and described above, the following component values represent those used in the best mode known to the inventor:

| | |
|---|---|
| Capacitor 41 | 1000 picofarads; |
| Resistor $R_c$ | 250 ohms; |
| Capacitor C1 | 0.1 microfarad; |
| Potentiometers 47 and 52 | 50 kilohms; |
| Resistor 64 | 10 kilohms; |
| Resistor 66 | 12 kilohms; |
| Resistors 67 and 70 | 47 kilohms; |
| Resistor 74 | 180 kilohms; and |
| Capacitor 76 | 39 microfarads. |

Amplifiers 12, 54, 60 and 61 are all of a kind similar to type 747 operational amplifier sold by, for example, Fairchild Camera & Instrument Corp., Mountain View, Calif.

FIG. 2 is a plot of signal strength errors versus signal-to-noise ratios. Using this graph, the curves of the error characteristics of the envelope detector and the phaselock detector may be compared. Curve 80 represents experimentally-obtained data using the QPSK phaselock detector as shown in FIG. 1 and described herein. Curves 81 and 82 depict measured responses of envelope detectors for discharge-charge resistance ratios of one and 200, respectively. Envelope detector responses to varying $R_d/R_c$ ratios are well known and are analyzed in detail in *General Radio Experiments*, vol. 31, no. 1, December 1956, and in *Acoustic Measurement*, by L.L. Beranek, published by John Wiley & Sons, Incl, New York, in 1966.

It may be noted that envelope detector curve 82 closely resembles a curve which is complementary to the phaselock detector curve 80. It is for this reason that an envelope detector discharge-charge resistance ratio of 200 has been selected as the optimal ratio to inversely match the QPSK phaselock detector control signal. Curve 83, shown as a dashed line, represents the summation of the signal strength errors shown in curves 80 and 82, which is the amplitude of the error of the measuring signal. It may thus be seen that the present invention provides a signal for measuring a QPSK modulated input signal, which measuring signal has an error of less than 0.5 dB for all input signals having signal-to-noise ratios over the range of normal interest.

The invention disclosed herein describes an apparatus for producing a measuring signal related, in the specific embodiment presented, to the strength of a QPSK modulated input signal employing a nonlinear frequency quadrupler as the carrier-extracting device. However, the principles which have been disclosed are equally applicable to other forms of modulation, including other modes of phase shift keying demodulation using nonlinear frequency multipliers, such as BPSK demodulation having a nonlinear frequency doubler. Each different type of nonlinear device requires individually determined gain control settings for optimal performance. In systems receiving both BPSK and QPSK modulated signals, it would be required to select the appropriate gain control setting for the mode of signal modulation received.

What is claimed is:

1. In a communications receiver including means for extracting a carrier signal from a modulated radio frequency input signal and further including means responsive to said carrier signal for generating a control signal having a dc voltage level indicative of the strength of said carrier signal, wherein said extracting means includes nonlinear elements such that the strength of said carrier signal is not linearly related to the strength of said input signal, an apparatus for providing a measuring signal which is substantially linearly related to the strength of said input signal, said apparatus comprising:
   detector means responsive to said input signal for providing a signal representative of the envelope of said input signal; and
   means for combining said envelope detector signal and said control signal to produce said measuring signal.

2. An apparatus for measuring the strength of a modulated radio frequency input signal to a communications receiver comprising:
   means responsive to said input signal for extracting the carrier frequency signal therefrom;
   means responsive to said carrier frequency signal for generating a control signal having a dc voltage level indicative of the strength of said carrier frequency signal;
   detector means responsive to said input signal for providing a signal representative of the envelope of said input signal;
   means for combining said envelope detector signal and said control signal to produce a measuring signal; and
   means responsive to said measuring signal for indicating the strength of said input signal.

3. The apparatus according to claim 1 or 2 further including means for amplifying said input signal applied to said extracting means.

4. The apparatus according to claim 3 wherein said measuring signal is coupled to said amplifying means to effect control of the gain of said amplifying means.

5. The apparatus according to claim 2 wherein said carrier extracting means includes a nonlinear frequency multiplier.

6. The apparatus according to claim 5 wherein said nonlinear frequency multiplier comprises a full-wave rectifier.

7. The apparatus according to claim 2 wherein said generating means includes a phaselock detector and wherein said control signal is related to the lock indicating signal of said phaselock detector.

8. The apparatus according to claim 1 or 2 wherein said detector means includes:
 first diode means for conducting the current of the negative cycles of said input signal to ground;
 capacitive means responsive to the positive cycles of said input signal for storing the charge energy of said positive cycles; and
 first resistive means for controlling the rate of charge of said capacitive means.

9. The apparatus according to claim 8 wherein said detector means further includes second resistive means for controlling the discharge rate of said capacitive means.

10. The apparatus according to claim 9 wherein said detector means further includes second diode means for opposing discharge current flow from said capacitive means into said first resistive means.

11. The apparatus according to claim 1 or 2 further including first filter means responsive to said envelope detector signal and second filter means responsive to said control signal.

12. The apparatus according to claim 11 wherein said first filter means includes capacitive means for storing the charge energy of said envelope detector signal, wherein said capacitive means is charged rapidly through a first resistive means when said envelope detector signal greatly exceeds the voltage across said capacitive means, wherein said capacitive means is discharged rapidly through a second resistive means when the voltage across said capacitive means greatly exceeds said envelope detector signal, and wherein said capacitive means charges and discharges slowly through a third resistive means when neither said envelope detector signal nor the voltage across said capacitive means greatly exceeds the other.

13. The apparatus according to claim 11 wherein said first and said second filter means are substantially identical.

14. The apparatus according to claim 1 or 2 wherein said combining means includes first and second diodes, said first diode poled to conduct the current of said envelope detector signal and said second diode poled to conduct the current of said control signal, said first and said second diodes being interconnected to sum said envelope detector signal and said control signal and thereby provide said measuring signal.

15. The apparatus according to claim 1 or 2 further including first and second variable resistance means responsive to said detector means and said control signal, respectively, for controlling the amplitude of said measuring signal.

\* \* \* \* \*